United States Patent [19]

Panico

[11] 4,443,533
[45] Apr. 17, 1984

[54] PHOTORESIST CURING METHOD

[76] Inventor: C. Richard Panico, 21 Leighton St., Medford, Mass. 02155

[21] Appl. No.: 401,318

[22] Filed: Jul. 23, 1982

[51] Int. Cl.³ .............................................. G03C 5/16
[52] U.S. Cl. .................................. 430/311; 430/313; 430/328; 430/394; 250/492.1
[58] Field of Search .............. 430/311, 313, 314, 328, 430/394; 204/155, 159.11; 250/341, 492.1

[56] References Cited

U.S. PATENT DOCUMENTS 4,167,669 9/1979 Panico ................................. 250/341

OTHER PUBLICATIONS

Allen et al., J. of Electrochemical Society, Jun., 1982, pp. 1379-1381.

Primary Examiner—John E. Kittle
Assistant Examiner—José G. Dees

[57] ABSTRACT

A method of post-development cure of photoresists is described wherein the substrate carrying the developed photoresist is positioned within 6.0 cm of a flash lamp and flashed with visible light to effect a cure in 30 seconds or less.

6 Claims, 3 Drawing Figures

PHOTORESIST CURING METHOD

BACKGROUND OF THE INVENTION

1. Field of the Invention

The present invention relates to the manufacture of optically delineated circuits and particularly to the curing of photoresists used in such manufacture by flash discharge arc lamps.

2. Description of the Prior Art

In the manufacture of integrated circuits, it is usual to slice a wafer from a semiconductor crystal, apply a photoresist to the surface of the wafer, illuminate the photoresist with a circuit pattern, develop the pattern (this is done by washing away the more soluble portions of the photoresist and may be either the illuminated or unilluminated portions depending on whether it is a positive or negative photoresist), curing the remaining photoresist, and treating the exposed wafer surface to form the desired circuit components and connections. The curing step is necessary to make the remaining photoresist impervious to the various treatment procedures.

For high resolution, ultraviolet sensitized photoresists are used with ultraviolet exposures. Curing is thus usually by ultraviolet also although other radiation and heat are usually present. Typical curing time has been one half hour and the curing process has produced two additional problems. One is a flowing of the photoresist reducing resolution. The other is erratic results in removal of the cured photoresist after completion of treating.

Curing or polymerization of various polymeric materials has been effected in the past with flash discharge arc lamps. U.S. Pat. Nos. 3,782,889 and 4,167,669 of the present inventor describe methods and apparatus for that purpose. In these prior patents there were no resolution requirements. Xenon flash lamps were used that normally put out energy over a broad spectrum extending both above and below the visible spectrum. Portions of the spectral output can be emphasized depending on gas mixture in the lamp, fill pressure, current density, pulse width, bore size and envelope material. High infrared output was considered the least desirable for the present purposes since the high temperatures produced could be expected to cause melting and flow while the high rate of energy input has been known in the past to cause spattering as could be expected by fast thermal expansion in discrete surface areas.

SUMMARY OF THE INVENTION

Now, in accordance with the invention it has been found that post development cures of photoresist can be effected in less than one minute with negligible resolution loss by flash radiation from a xenon flash lamp operated with design parameters for emphasizing visible light output. Thus it is an object of the invention to provide a method of post development cure of photoresist using flash lamps. p Further objects and features of the invention will become apparent upon reading the following disclosure together with the drawing.

DESCRIPTION OF THE PREFERRED EMBODIMENT

The invention has its present greatest utility in integrated circuit manufacture. A waver of semiconductor crystal is sliced from a mother crystal and coated with ultraviolet-sensitive photoresist. An ultraviolet exposure is then made through an iterated pattern of the integrated circuit. For both compact size and economy, it is desirable to obtain as many of the circuits as possible from the single wafer. The wavelength of the radiation used in the photoexposure is a limiting factor on resolution. The shorter the wavelength, the higher the possible resolution. For this reason ultraviolet, with wavelengths shorter than visible light, is used. The ultraviolet photoexposure effects a partial cure of the photoresist so that the unexposed portion may be washed away in the following development step. Following development, the remaining photoresist receives a post development cure making it impervious to the complex treatment steps used in forming the integrated circuits.

Figure 1:
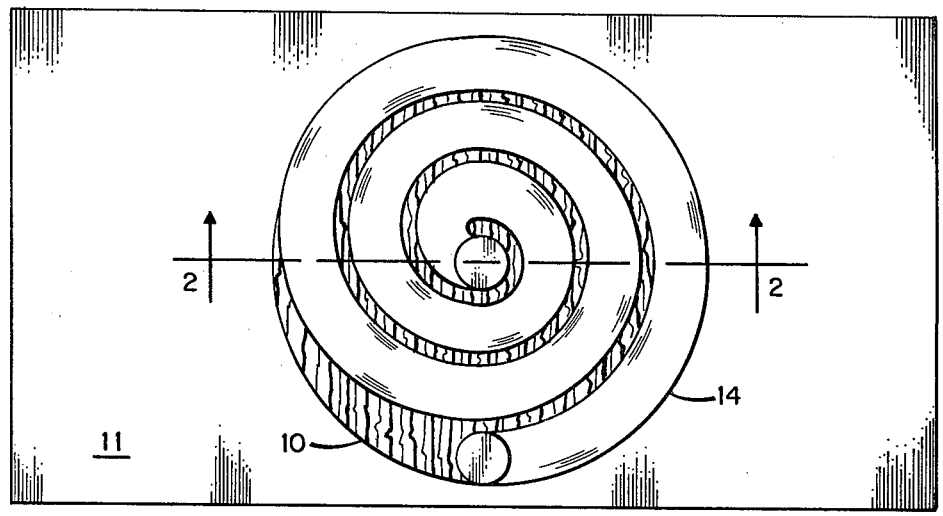
FIG. 1 is a plan view depicting flash curing according to the invention.
Figure 2:
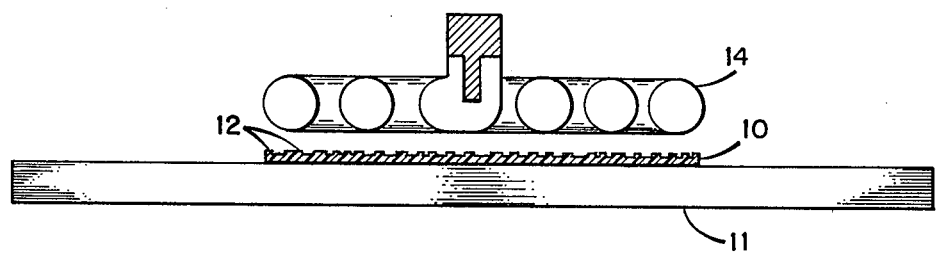
FIG. 2 is a cross section through 2—2 of FIG. 1.

Referring now to the drawing, FIG. 1 and FIG. 2 are plan and cross-sectional views of the post development cure. Wafer 10 is positioned on work table 11 with developed photoresist coating 12 facing flash lamp 14. Flash lamp 14 is flashed to effect the post development cure. The details of the method are best explained by example.

EXAMPLE

Semiconductor wafer 10 was 3 inches in diameter and carried a developed photoresist coating 1.5 microns thick of AZ-5000 a positive photoresist of AZ Photoresist Products, Somerville, N.J. Flash lamp parameters:

| | |
|---|---|
| 1. Arc length | 16 inches |
| 2. Bore | 7 mm |
| 3. Outside diameter | 9 mm |
| 4. Shape | 3-turn spiral |
| 5. Spiral diameter | 3 inches |
| 6. Fill | Xenon at 250 mm pressure |
| 7. Current density | 1560 Amps/cm$^2$ |
| 8. Pulse length | 140 msec. |
| 9. Pulse rate | 7 pps |
| 10. Voltage | 3.2 KV |
| 11. Capacitance | 32 ufd. |
| 12. Inductance | 100 uh |

In this example, the spacing between the surface of photoresist 11 and the outside of the lamp envelope was 7.0 mm. The full time of exposure was two seconds. The spectral distribution of the lamp output was substantially that shown in solid curve 1 of FIG. 3. The photoresist was completely cured.

The parameters given in the above example are subject to considerable variation. Lamps have been made in a zig-zag and other shapes. Lamps may be operated in series, in parallel or in a combination. The spacing between the lamp and the photoresist is preferably in the range of 6.0 mm to 6.0 cm for efficiency. The pulse rate is most effective in the 1 to 10 pulses per second range. The electrical current density in the lamp should be in the 400 amps/cm$^2$ to 2000 amps/cm$^2$ range to obtain the correct spectral output. The pulse length, fill pressure and gas mixture are important in obtaining the desired spectral output. Variations can be used as long as they do not cause substantial changes in the spectral output. Exposure time ranges from ½ to 30 seconds.

In the sample above, there was negligible loss in resolution and after the integrated circuits had been formed, the photoresist removed cleanly in the removal step.

Figure 3:
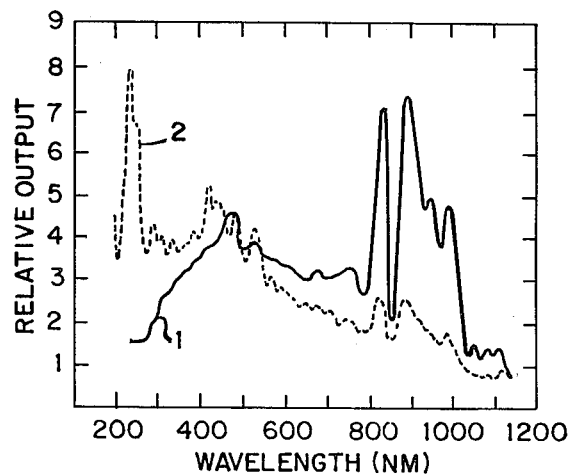
FIG. 3 is a spectral distribution graph showing xenon flash output radiation at a current density suitable for the invention and at a current density for high ultraviolet output.

FIG. 3 depicts the spectral distribution curve (curve 1) that has produced the unexpected results and showing high output in the 800 to 1100 NM wavelength region. Curve 2 shows the spectral distribution curve that was expected to give improved results over past methods. Curve 2 with its high output in the 200 to 300 NM wavelength range is obtained with current densities of over 6000 amps/cm$^2$. Obtaining questionable results and having high lamp failure rates operating at these current densities, the present inventor went against instructions and theory to experiment with lower current densities. The results obtained in accordance with the invention are still not fully explained. It is believed that the powerful magnetic field put out by the flash lamp, due to the heavy direct current discharge through it, is a significant factor. Since this belief has yet to be fully proven, it is not intended to be limiting on the invention.

While the invention has been described with relation to a specific embodiment, it is not intended to be limited thereby, but it is intended to cover the invention as set forth in the following claims.

I claim:

1. In a method of forming optically delineated circuits comprising applying a photoresist to a substrate; exposing said photoresist to a photoexposure of a circuit pattern; developing said photoresist by washing away the unexposed portions; curing the remaining photoresist; and treating the exposed substrate surface to provide electrical circuits, the combination of step to produce said curing comprising:
   (a) positioning said substrate so that the surface of the remaining photoresist is spaced in the range of 6.0 mm to 6.0 cm from the envelope of a flash arc lamp; and,
   (b) discharging at least one electrical pulse through said lamp with a current density in said lamp in the range of 400 to 2000 amperes per square centimeter.

2. In the method according to claim 1, the combination wherein said discharging is at the rate of one to ten pulses per second.

3. In the method according to claim 2, the combination wherein said discharging takes place over a time interval of one-half second to thirty seconds.

4. In the method according to claim 1, the combination wherein said lamp is filled with xenon gas and the fill pressure of said gas and the pulse length at which the lamp is operated are designed to emphasize output radiation in the visible spectrum with wavelengths longer than 300 nanometers.

5. In the method according to claim 1, the combination wherein said substrate is circular and said lamp is shaped in a flat spiral.

6. In a method according to claim 1, wherein said applying comprises applying a photoresist to a wafer of semiconductor crystal and said exposing comprises exposing said photoresist to a photoexposure of iterated integrated circuit patterns.

* * * * *